US006861319B2

(12) United States Patent
Hoshino et al.

(10) Patent No.: US 6,861,319 B2
(45) Date of Patent: Mar. 1, 2005

(54) GATE ELECTRODE AND METHOD OF FABRICATING THE SAME

(75) Inventors: Akira Hoshino, Tokyo (JP); Kanta Saino, Tokyo (JP); Shinichi Horiba, Tokyo (JP); Tsutomu Hayakawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/356,980

(22) Filed: Feb. 3, 2003

(65) Prior Publication Data

US 2003/0146457 A1 Aug. 7, 2003

(30) Foreign Application Priority Data

Feb. 1, 2002 (JP) ........................................ 2002-025179

(51) Int. Cl.⁷ ............................................ H01L 21/336
(52) U.S. Cl. ...................... 438/303; 438/595; 438/655; 438/663; 257/377; 257/413
(58) Field of Search ................................. 438/303, 522, 438/582, 592, 595, 663, 683, 685, 184, 265; 257/377, 382, 384, 412, 456, 768, 250, 413, 388

(56) References Cited

U.S. PATENT DOCUMENTS 5,723,893 A * 3/1998 Yu et al. .................... 257/413
5,851,890 A * 12/1998 Tsai et al. ................... 438/303
6,136,678 A * 10/2000 Adetutu et al. ............. 438/592
2002/0110966 A1 * 8/2002 Lee ............................ 438/184

FOREIGN PATENT DOCUMENTS

| JP | 08-321613 | 12/1996 |
| JP | 09-307106 | 11/1997 |
| JP | 11-233451 | 8/1999 |

* cited by examiner

Primary Examiner—David Nelms
Assistant Examiner—Long Tran
(74) Attorney, Agent, or Firm—Katten Muchin Zavis Rosenman

(57) ABSTRACT

There is provided a method of fabricating a gate electrode, including the steps of (a) forming a gate oxide film at a surface of a semiconductor substrate, (b) forming a multi-layered structure on the gate oxide film, the multi-layered structure including a polysilicon layer formed on the gate oxide film, a refractive metal silicide layer formed on the polysilicon layer, and a silicon nitride layer formed on the refractive metal silicide layer, (c) thermally annealing the multi-layered structure in a nitrogen atmosphere to thereby form a silicon nitride film on sidewalls of the polysilicon layer and the refractive metal silicide layer, and (d) oxidizing the semiconductor substrate and the multi-layered structure.

7 Claims, 9 Drawing Sheets

GATE ELECTRODE AND METHOD OF FABRICATING THE SAME

BACKGROUND OF THE INVENTION

1. Field of the Invention

The invention relates to a semiconductor device and a method of fabricating the same, and more particularly to a low-resistive gate electrode which is capable of preventing reduction in an operation speed of a semiconductor device, and a method of fabricating such a low-resistive gate electrode.

2. Description of the Related Art

In a field of a semiconductor device such as a large-scale integrated (LSI) circuit, various proposals have been made in order to accomplish reduction in an electrical resistance of a gate electrode.

For instance, there has been suggested a metal gate structure comprised of a gate electrode formed on a gate oxide film and composed of a metal such as aluminum (Al).

The metal gate structure makes it possible to reduce an electrical resistance in a gate electrode. However, the metal gate structure is accompanied with a problem of reduction n a resistance to heat. This causes another problem that annealing at a high temperature for enhancing reliability and performance of a transistor cannot be carried out after formation of a gate electrode.

There has been suggested a silicon gate structure comprised of an impurity-doped polysilicon (DOPOS) layer formed on a gate oxide film formed at a surface of a semiconductor substrate.

The silicon gate structure presents an advantage that a gate electrode can be formed subsequently to the formation of a gate oxide film in an initial stage in a process of fabrication of a semiconductor device, and hence, it would be possible to prevent the gate oxide film from being contaminated with dust. However, the silicon gate structure is accompanied with a problem that there is a limit in reduction in an electrical resistance in a gate electrode because of a high layer or sheet resistance.

Hence, in order to further reduce an electrical resistance of a gate electrode, there has been suggested a polycide gate comprised of a refractory metal silicide layer such as a tungsten silicide (WSi$_2$), formed on a thin DOPOS layer formed on a gate oxide film. Since the polycide gate could be fabricated to have a lower electrical resistance and further a higher resistance to heat than those of the above-mentioned silicon gate structure. Thus, a polycide gate is selected in fabrication of a MOS device in these days.

In order to further reduce an electrical resistance of a gate electrode, there has been further suggested a polymetal gate structure comprised of a refractory metal layer such as a tungsten layer, formed on a thin DOPOS layer formed on a gate oxide film.

The polymetal gate makes it possible to make a sheet resistance smaller than the above-mentioned silicon gate structure and polycide gate, which ensures enhancement in a response speed in a semiconductor device such as a MOS device. However, the polymetal gate is accompanied with a problem that a refractory metal layer would react with a DOPOS layer in a process of thermally annealing at a high temperature, resulting in that an impurity concentration of the DOPOS layer would be reduced, and further, metal atoms are diffused out of the refractory metal layer.

In order to solve this problem, Japanese Patent Application Publication No. 11-233451 which is based on U.S. patent application Ser. No. 061557 filed on Oct. 7, 1997 by Texas Instrument Incorporated has suggested a gate electrode which is capable of suppressing reaction in a process of thermally annealing at a high temperature. The suggested gate electrode is designed to include a refractive metal nitride layer such as a tungsten nitride (WN) layer, sandwiched between a refractive metal layer and a DOPOS layer.

In fabrication of the suggested gate electrode, a process of thermally annealing is carried out after the formation of a refractive metal nitride layer on a DOPOS layer. This removes nitrogen excessively contained in the refractive metal nitride layer, and converts the refractive metal nitride layer in composition into a refractive metal silicide nitride layer such as WSiN.

However, if a process of thermally annealing is carried out after a refractive metal nitride layer has been formed on the DOPOS layer, the refractive metal nitride layer highly reacts with silicon existing in the DOPOS layer, resulting in that there is formed a thick refractive metal silicide nitride layer. Though a refractive metal silicide nitride layer well acts as a barrier, it has a high interface resistance in dependence on its composition or a structure of layered films, resulting in a resultant gate electrode would have a high electrical resistance. Accordingly, a thicker refractive metal silicide nitride layer would make is more difficult to reduce an electrical resistance of a gate electrode.

FIGS. 1A to 1C are cross-sectional views of a gate electrode having a polycide gate structure, illustrating respective steps in a process of fabricating the gate electrode.

As illustrated in FIG. 1C, a gate electrode 50 is comprised of a DOPOS layer 53 formed on a silicon dioxide film 52 formed at a surface of a silicon substrate 51 as a gate oxide film, a WSi$_2$ layer 54 formed on the DOPOS layer 53, a SiN layer 55 formed on the WSi$_2$ layer 54, an oxide film 56a covering sidewalls of the DOPOS layer 53 and the WSi$_2$ layer 54 therewith, and a sidewall 57 covering the oxide film 56a and a sidewall of the SiN layer 55 therewith.

Hereinbelow is explained a process of fabricating the gate electrode 50 illustrated in FIG. 1C.

As illustrated in FIG. 1A, a multi-layered structure 59 comprised of the DOPOS layer 53, the WSi$_2$ layer 54 and the SiN layer 55 is formed on the silicon substrate 51. Then, the multi-layered structure 59 is thermally annealed in an oxygen atmosphere, that is, rapid thermal oxidation (RTO) is carried out to the multi-layered structure 59. Thus, as illustrated in FIG. 1B, the DOPOS layer 53 and the WSi$_2$ layer 54 are oxidized at their sidewalls with the result that the oxide film 56a is formed around the sidewalls, and the silicon substrate 51 is partially oxidized with the result that an oxide film 56b is formed in the silicon substrate 51 under the silicon dioxide film 52.

Then, areas of the silicon substrate 51 in which NMOS and PMOS transistors are to be formed are covered with a resist film. Then, ion implantation is carried out to the silicon substrate 51 with the multi-layered structure 59 including the oxide film 56a, being used as a mask.

Specifically, arsenic (As) is implanted into an area where an NMOS transistor is to be formed, and BF$_2$ is implanted into an area where a PMOS transistor is to be formed, for instance. As a result, a lightly-doped ion-implanted layer 58a having LDD (low-doped-drain) structure is formed in the silicon substrate 51 in dependence on the multi-layered structure 59.

Then, for instance, a silicon nitride film is formed entirely over the multi-layered structure 59. By etching back the silicon nitride film, the sidewall 57 is formed on a sidewall of the multi-layered structure 59, as illustrated in FIG. 1C.

Then, the areas in which NMOS and PMOS transistors are to be formed are covered with a resist film. Then, ion implantation is carried out to the silicon substrate 51 with the multi-layered structure 59 including the sidewall 57, being used as a mask, similarly to the formation of the lightly-doped ion-implanted layer 58a. As a result, a heavily-doped diffusion layer 58b is formed in the silicon substrate 51.

The gate electrode 50 having such a polycide gate structure as mentioned above has advantages that it can recover damages of the silicon substrate 51 caused by gate etching and ion implantation, and has a sufficient resistance to thermally annealing necessary for activating impurities having been implanted into the silicon substrate 51.

However, the gate electrode 50 is accompanied with problems as follows.

With a requirement of reduction in a size of a transistor, a self-align contact (SAC) structure is frequently used for arranging wirings in a transistor.

In order to accomplish a SAC structure, it is necessary to form the sidewall 57 comprised of a silicon nitride (SiN) film around a sidewall of the multi-layered structure 59, as illustrated in FIG. 1C. If the sidewall 57 comprised of a silicon nitride (SiN) film is formed directly on a sidewall of the DOPOS layer 53, a resultant transistor would have a reduced resistance to hot electron, resulting in deterioration in reliability of a transistor. Accordingly, in general, the sidewall 57 comprised of a silicon nitride (SiN) film is formed around the multi-layered structure 59 after the DOPOS layer 53 has been oxidized at a sidewall thereof.

If a gate electrode is thermally annealed in a furnace at a high temperature for long time (for instance, at 1000 degrees centigrade for 1 hour) in order to oxidize a sidewall of the DOPOS layer 53, impurities implanted into the silicon substrate 51 are horizontally diffused, resulting in that it would become quite difficult to form a transistor in a small size, and that integration of a transistor would be reduced. Hence, rapid thermal oxidation (RTO) is generally carried out by means of a ramp annealer, for instance, for oxidizing a sidewall of the DOPOS layer 53. Rapid thermal oxidation can oxidize a sidewall of the DOPOS layer 53 at a moment.

An oxidation rate of the silicon substrate 51 is smaller than oxidation rates of the DOPOS layer 53 and the $WSi_2$ layer 54. In other words, sidewalls of the DOPOS layer 53 and the $WSi_2$ layer 54 are more easily oxidized than the silicon substrate 51. Hence, if rapid thermal oxidation is carried out immediately after the formation of the multi-layered structure 59, sidewalls of the DOPOS layer 53 and the $WSi_2$ layer 54 would horizontally project, as illustrated in FIG. 1B. The $WSi_2$ layer 54 is particularly likely to be oxidized. Since crystal grains grow in oxidation of the $WSi_2$ layer 54, the oxide film 56a projects in a shape of an arc on a sidewall of the $WSi_2$ layer 54.

As a result that the oxide film 56a projects on a sidewall of the $WSi_2$ layer 54, the lightly-doped ion-implanted layer 58a is formed merely in an area starting from a location located just below a summit of the projecting oxide film 56a. This results in that a designed gate length L1 would become an actual length L2 longer than the length L1. That is, a gate length would become longer than designed. Such unexpected extension in a gate length would prevent a transistor from being fabricated in a small size, and would significantly deteriorate reliability of a transistor.

In addition, the projecting oxide film 56a causes the following problems.

FIG. 2 is a cross-sectional view of a transistor, illustrating a step to be carried out subsequently to the step illustrated in FIG. 1C.

After the sidewall 57 has been formed on a sidewall of the multi-layered structure 59, an interlayer insulating film 60 is formed all over the silicon substrate 51.

Then, contact holes are formed throughout the interlayer insulating film 60 by photolithography and dry etching. Then, metal or polysilicon is buried in each of the contact holes to thereby form contact plugs 61.

After the interlayer insulating film 60 has been planarized at a surface thereof, a wiring layer 62 is formed on the interlayer insulating film 60.

Since an arc shape of the oxide film 56a is reflected to a shape of the sidewall 57 formed on the oxide film 56a, the sidewall 57 also horizontally projects due to a portion of the oxide film 56a covering the $WSi_2$ layer 54 therewith.

As a result, when the interlayer insulating film 60 is formed, there are generated voids 63 caused by defect in deposition of the interlayer insulating film 60, between the sidewalls 57 of the adjacent gate electrodes 50. Since the voids 63 are filled with a material of which the contact plug 61 is composed, such as metal or polysilicon, there is caused a problem that contact holes located adjacent to each other ill a longitudinal direction (a direction perpendicular to a plane of FIG. 2) of the gate electrode 50 might be short-circuited with each other.

Japanese Patent Application Publication No. 8-321613 has suggested a method of fabricating a semiconductor device, including the steps of forming a gate oxide film at a surface of a semiconductor substrate, forming a polysilicon film on the gate oxide film, forming a refractive metal silicide film on the polysilicon film, patterning the refractive metal silicide film and the polysilicon film to thereby form a gate electrode, ion-implanting nitrogen obliquely into the gate electrode while the gate electrode is in rotation, and oxidizing the gate electrode.

Japanese Patent Application Publication No. 9-307106 has suggested a method of fabricating a semiconductor device, including the steps of forming a first electrically insulating layer on a semiconductor substrate, forming a polysilicon film on the first electrically insulating layer, patterning the polysilicon film into a gate electrode of a MOS transistor, and nitriding the semiconductor substrate to thereby form a silicon nitride film around a sidewall of the gate electrode.

However, the above-mentioned problems remain unsolved even in the above-mentioned Japanese Patent Application Publications.

SUMMARY OF THE INVENTION

In view of the above-mentioned problems in the conventional gate electrodes, it is an object of the present invention to provide a gate electrode having a polycide gate structure, which is capable of preventing horizontal projection of an oxide film to be formed on a sidewall of a gate electrode, and maintaining a transistor in a small size and keeping a high operation speed of a transistor.

It is also an object of the present invention to provide a method of fabricating such a gate electrode.

In one aspect of the present invention, there is provided a method of fabricating a gate electrode, including the steps of (a) forming a gate oxide film at a surface of a semiconductor substrate, (b) forming a multi-layered structure on the gate oxide film, the multi-layered structure including a polysilicon layer formed on the gate oxide film, a refractive metal suicide layer formed on the polysilicon layer, and a silicon nitride layer formed on the refractive metal silicide layer, (c) thermally annealing the multi-layered structure in a nitrogen atmosphere to thereby form a silicon nitride film on sidewalls of the polysilicon layer and the refractive metal silicide layer, and (d) oxidizing the semiconductor substrate and the multi-layered structure.

A refractive metal layer may be further formed between the refractive metal silicide layer and the silicon nitride layer in the step (b).

For instance, the refractive metal silicide layer is composed of any one of $WSi_2$, $TiSi_2$, $VSi_2$, $CrSi_2$, $ZrSi_2$, $NbSi_2$, $MoSi_2$, $TaSi_2$, $CoSi_2$ and PdSi.

For instance, the refractive metal layer is composed of any one of tungsten (W), molybdenum (Mo), titanium (Ti) and tantalum (Ta).

It is preferable that the nitrogen atmosphere contains impurity other than nitrogen at 1 volume percent or smaller, wherein the impurity is oxygen, for instance.

It is preferable that the multi-layered structure is thermally annealed in the step (c) at 1050 to 1100 degrees centigrade both inclusive.

In another aspect of the present invention, there is provided a gate electrode formed on a gate oxide film formed at a surface of a semiconductor substrate, including (a) a multi-layered structure including a polysilicon layer formed on the gate oxide film, a refractive metal silicide layer formed on the polysilicon layer, and a silicon nitride layer formed on the refractive metal silicide layer, and (b) a silicon nitride film formed on sidewalls of the polysilicon layer and the refractive metal silicide layer.

The gate electrode may further include a refractive metal layer formed between the refractive metal silicide layer and the silicon nitride layer.

For instance, the refractive metal silicide layer is composed of any one of $WSi_2$, $TiSi_2$, $VSi_2$, $CrSi_2$, $ZrSi_2$, $NbSi_2$, $MoSi_2$, $TaSi_2$, $CoSi_2$ and PdSi.

For instance, the refractive metal layer is composed of any one of tungsten (W), molybdenum (Mo), titanium (Ti) and tantalum (Ta).

The advantages obtained by the aforementioned present invention will be described hereinbelow.

In accordance with the present invention, a gate wiring or a multi-layered structure comprised of the polysilicon layer, the refractive metal silicide layer, and the silicon nitride layer is thermally annealed in a nitrogen atmosphere prior to oxidation of the gate wiring or multi-layered structure, to thereby form the silicon nitride film on sidewalls of the polysilicon layer and the refractive metal silicide layer. The semiconductor substrate not covered with the silicon nitride film is oxidized by the thermal annealing carried out in a nitrogen atmosphere, whereas the polysilicon layer and the refractive metal silicide layer whose sidewalls are covered with the silicon nitride film are oxidized more slowly than the semiconductor substrate not covered with the silicon nitride film, because the silicon nitride film prevents penetration of oxygen into the polysilicon layer and the refractive metal silicide layer. Hence, an oxide film resulted from the oxidation and formed around the polysilicon layer and the refractive metal silicide layer does not project horizontally.

A conventional gate electrode is accompanied with a problem that an oxide film excessively growing around a sidewall of the gate electrode causes an actual gate length to be longer than a designed gate length. In contrast, in the gate electrode in accordance with the present invention, the oxide film does scarcely project unlike the oxide film in the conventional gate electrode. Hence, an actual gate length is quite slightly longer than or almost equal to a designed gate length, ensuring that a resultant transistor can be fabricated in a small size and prevent reduction in an operation speed thereof.

In addition, a conventional gate electrode is accompanied further with a problem that voids are generated in an interlayer insulating film covering the gate electrode therewith due to a projection of the oxide film, resulting in that adjacent contact plugs are short-circuited with each other. In contrast, in the gate electrode in accordance with the present invention, the oxide film does scarcely project unlike the oxide film in the conventional gate electrode. Thus, the gate electrode in accordance with the present invention prevents generation of such voids, and hence, prevents adjacent contact plugs from being short-circuited with each other.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 3A:
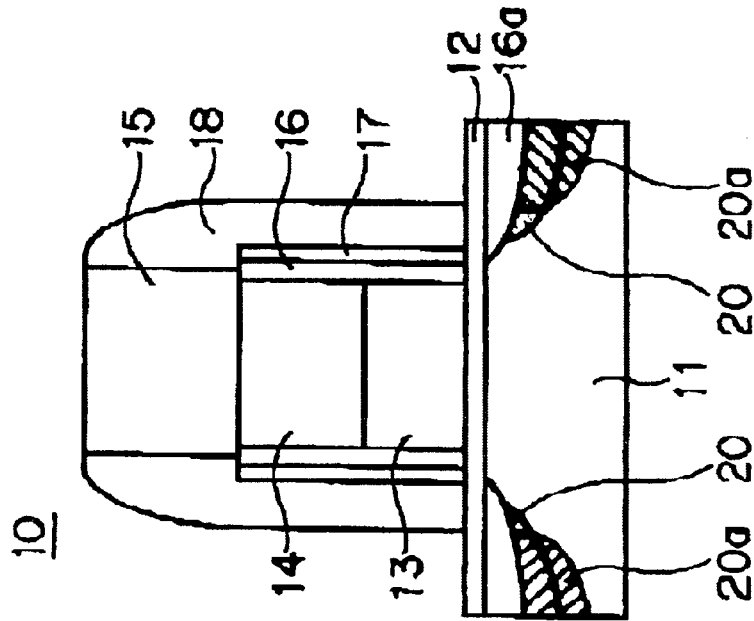
FIGS. 3A to 3C are cross-sectional views of a gate electrode in accordance with the first embodiment of the present invention, illustrating respective steps in a process of fabricating the same.
Figure 3B:
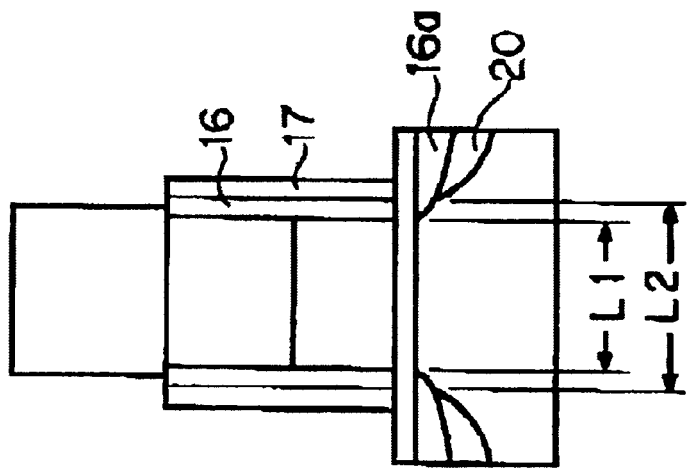
Figure 3C:
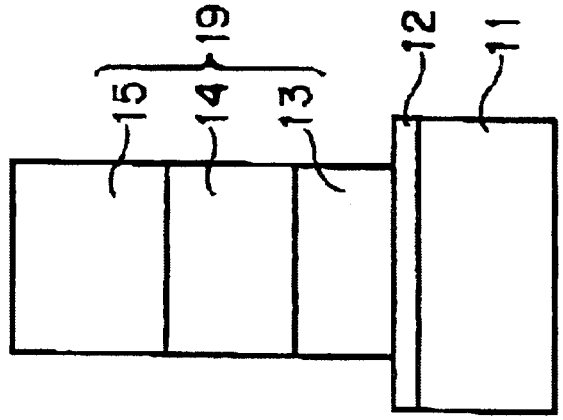

FIG. 3C is a cross-sectional view of a gate electrode in accordance with the first embodiment of the present invention.

As illustrated in FIG. 3C, a gate electrode 10 in accordance with the first embodiment of the present invention is comprised of an impurity-doped polysilicon (DOPOS) layer 13 formed on a silicon dioxide film 12 formed at a surface of a silicon substrate 11, a $WSi_2$ layer 14 formed on the DOPOS layer 13 as a refractive metal silicide layer, a silicon nitride (SiN) layer 15 formed on the $WSi_2$ layer 14, an oxide film 16 formed on sidewalls of the DOPOS layer 13 and the $WSi_2$ layer 14, a silicon nitride (SiN) film 17 covering the oxide film 16 therewith, and a sidewall 18 formed covering the silicon nitride film 17 and a sidewall of the silicon nitride film 15 therewith.

Hereinbelow is explained a method of fabricating the gate electrode 10 in accordance with the first embodiment.

First, as illustrated in FIG. 3A, the silicon dioxide film 12 is formed as a gate oxide film at a surface of the silicon substrate 1.

Then, a multi-layered structure 19 is formed on the silicon dioxide film 12. The multi-layered structure 19 is comprised of the DOPOS layer 13 formed on the silicon dioxide film 12, the $WSi_2$ layer 14 formed on the DOPOS layer 13, and the silicon nitride layer 15 formed on the $WSi_2$ layer 14.

Then, the multi-layered structure 19 is thermally annealed in an nitrogen or ammonia atmosphere at 1050 degrees centigrade, for instance. Specifically, rapid thermal oxidation (RTO) is carried out to the multi-layered structure 19 by means of a ramp annealer in order to nitride the multi-layered structure 19. Thus, as illustrated in FIG. 3B, the DOPOS layer 13 and the $WSi_2$ layer 14 are oxidized only at their sidewalls with the result that the silicon nitride film 17 is formed on sidewalls of the DOPOS layer 13 and the $WSi_2$ layer 14 by a thickness of a few nanometers.

Then, rapid thermal oxidation (RTO) is carried out to the multi-layered structure 19 in an oxygen atmosphere at 1050 degrees centigrade, for instance, by means of a ramp annealer in order to oxidize the multi-layered structure 19.

As a result, the silicon substrate 11 is oxidized in portions not covered with the silicon nitride film 17. In contrast, in the DOPOS layer 13 and the $WSi_2$ layer 14 whose sidewalls are covered with the silicon nitride film 17, the silicon nitride film 17 prevents penetration of oxygen into the DOPOS layer 13 and the $WSi_2$ layer 14. Hence, the DOPOS layer 13 and the $WSi_2$ layer 14 are oxidized at a smaller rate than a rate at which the silicon substrate 11 not covered with the silicon nitride film 17 is oxidized.

As illustrated in FIG. 3B, as a result of the oxidation, the oxide film 16 is formed around the DOPOS layer 13 and the $WSi_2$ layer 14, and an oxide film 16a is formed at a surface of the silicon substrate 11.

Then, areas of the silicon substrate 11 in which NMOS and PMOS transistors are to be formed are covered with a resist film. Then, ion implantation is carried out to the silicon substrate 11 with the multi-layered structure 19 including the oxide film 16 and the silicon nitride film 17, being used as a mask.

Specifically, arsenic (As) is implanted into an area where an NMOS transistor is to be formed, and $BF_2$ is implanted into an area where a PMOS transistor is to be formed, for instance. As a result, a lightly-doped ion-implanted layer 20 having LDD (low-doped-drain) structure is formed in the silicon substrate 11 in association with the multi-layered structure 19.

Then, for instance, a silicon nitride film is formed entirely over the multi-layered structure 19. By etching back the silicon nitride film, the sidewall 18 is formed on a sidewall of the multi-layered structure 19, as illustrated in FIG. 8C.

Then, the areas in which NMOS and PMOS transistors are to be formed are covered with a resist film. Then, ion implantation is carried out to the silicon substrate 11 with the multi-layered structure 19 including the sidewall 18, being used as a mask, similarly to the formation of the lightly-doped ion-implanted layer 20. As a result, a heavily-doped diffusion layer 20a is formed in the silicon substrate 11.

Figure 1:
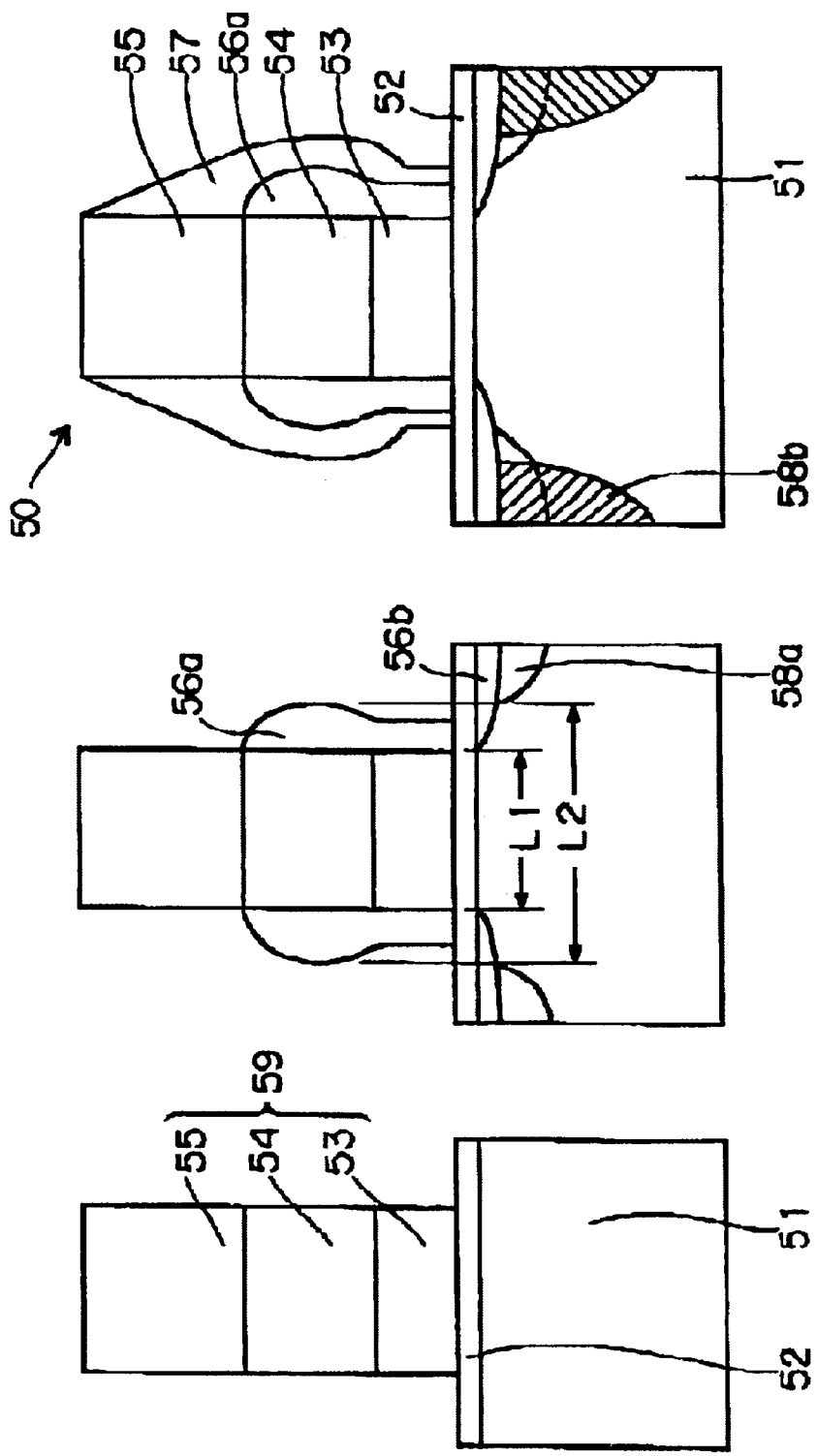
FIGS. 1A to 1C are cross-sectional views of a conventional gate electrode, illustrating respective steps in a process of fabricating the same.

In accordance with the gate electrode 10, the oxide film 16 formed on a sidewall of the $WSi_2$ layer 14 by rapid thermal oxidation is thinner than the oxide film 56a illustrated in FIG. 1C in the conventional gate electrode 50, and hence, the oxide film 16 scarcely projects horizontally unlike the oxide film 56a in the conventional gate electrode 50. Thus, since the lightly-doped ion-implanted layer 20 is formed in an area starting from a location located just below the silicon nitride film 17, an actual gate length L2 is quite slightly longer than or almost equal to a designed gate length L1, ensuring that a resultant transistor can be fabricated in a small size and prevent reduction in an operation speed of a transistor.

Figure 2:
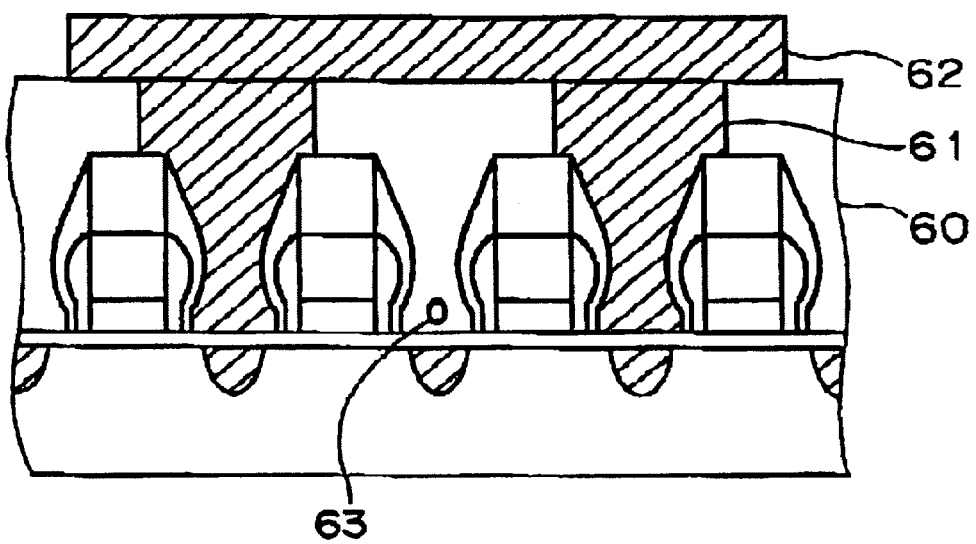
FIG. 2 is a cross-sectional view of a semiconductor device including the conventional gate electrode illustrated in FIG. 1.

In the conventional gate electrode illustrated in FIG. 2, the voids 63 are caused in the interlayer insulating film 60 due to the projection of the sidewall 57 which reflects the projection of the oxide film 56a. In contrast, the gate electrode 10 in accordance with the first embodiment prevents the oxide film 16 from horizontally projecting, and accordingly, prevents the sidewall 18 from horizontally projecting. Thus, the gate electrode 10 makes it possible to prevent generation of the voids 63, and hence, prevent contact plugs located adjacent to each other from short-circuiting with each other.

In the above-mentioned first embodiment, though a refractive metal silicide layer is comprised of the $WSi_2$ layer 14, it should be noted that a $TiSi_2$ layer, a $VSi_2$ layer, a $CrSi_2$ layer, a $ZrSi_2$ layer, a $NbSi_2$ layer, a $MoSi_2$ layer, a $TaSi_2$ layer, a $CoSi_2$ layer or a PdSi layer may be selected as a refractive metal silicide layer in place of the $WSi_2$ layer 14.

FIGS. 4A to 4H are cross-sectional views of a semiconductor device including the gate electrode 10 in accordance with the first embodiment, illustrating respective steps in a process of fabricating the same. Hereinbelow is explained a method of fabricating a semiconductor device including the gate electrode 10, with reference to FIGS. 4A to 4H.

Figure 4A:
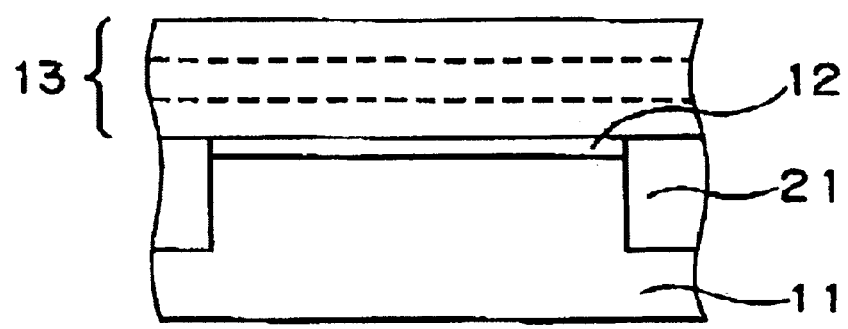
FIGS. 4A to 4H are cross-sectional views of a semiconductor device including the gate electrode in accordance with the first embodiment of the present invention, illustrating respective steps in a process of fabricating the same.

First, as illustrated in FIG. 4A, insulating layers 21 are formed at a surface of a p-type silicon substrate 11 to thereby define device fabrication areas in each of which a transistor is to be fabricated.

Then, the p-type silicon substrate 11 is thermally annealed in a steam and oxygen gas atmosphere, for instance, at 850 degrees centigrade for 4 hours.

As a result, a silicon dioxide film as the gate oxide film 12 is formed at a surface of the p-type silicon substrate 11 in a device fabrication area. The gate oxide film 12 has a thickness of 4 nm, for instance.

Then, chemical vapor deposition (CVD) is applied to the resultant to thereby form the phosphorus-doped DOPOS layer 13 on the gate oxide film 12. The DOPOS layer has a thickness of about 100 nm. The DOPOS layer 13 is formed, for instance, by keeping a growth furnace in which the silicon substrate 11 is placed, at a pressure of 100 Pa, and thermally annealing the silicon substrate 11 in the growth furnace in an atmosphere of a mixture gas of silane ($SiH_4$) at a flow rate of 3000 sccm and phosphine ($PH_3$) at a flow rate of 70 sccm. The silicon substrate 11 is thermally annealed in such conditions at 580 degrees centigrade for an hour, for instance. As a result of thermally annealing the silicon substrate 11, there is formed the DOPOS layer 13 having a thickness of 120 nm and containing phosphorus (P) at a concentration of 2E20 atoms/$cm^3$.

As illustrated in FIG. 4A with a broken line, the DOPOS layer 13 may be comprised of a three-layered structure formed by growing silicon separately in three stages to thereby differentiate crystal directions from one another in each of the three layers.

Then, the DOPOS layer 13 is washed with mixture solution of HF and $H_2O_2$ to thereby remove an oxidize layer naturally formed at a surface of the DOPOS layer 13.

Figure 4B:
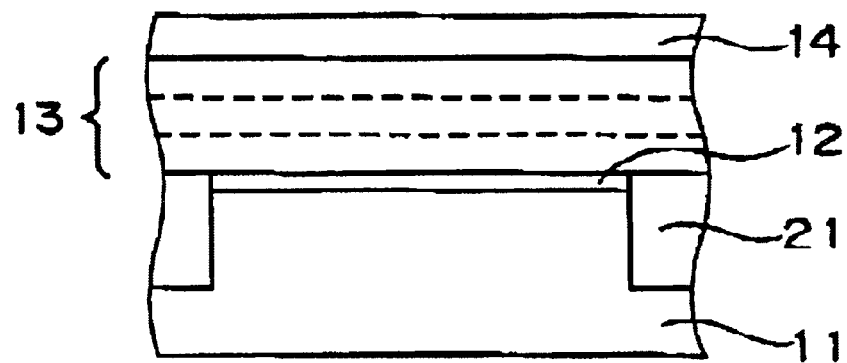

Then, as illustrated in FIG. 4B, the tungsten silicide ($WSi_2$) layer 14 is formed on the DOPOS layer 13 by chemical vapor deposition (CVD).

For instance, the tungsten silicide ($WSi_2$) layer 14 having a thickness of 150 nm is formed by keeping the silicon substrate 11 at 500 degrees centigrade in a growth furnace, and thermally annealing the silicon substrate 11 in the growth furnace in an atmosphere of a mixture gas of dichlorosilane ($SiH_2Cl_2$) at a flow rate of 200 sccm and $WF_6$ at a flow rate of 4 sccm.

Figure 4C:
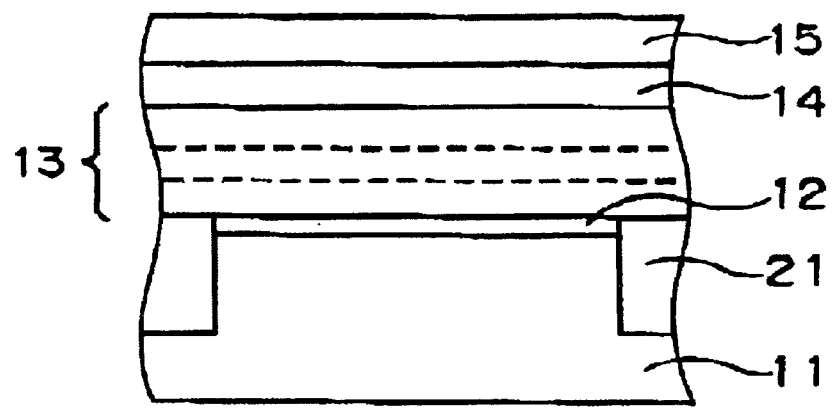

Then, the tungsten silicide ($WSi_2$) layer 14 is washed at a surface thereof with hydrofluoric acid. Then, as illustrated in FIG. 4C, the silicon nitride (SiN) layer 15 is formed on the tungsten silicide ($WSi_2$) layer 14 by chemical vapor deposition. The silicon nitride (SiN) layer 15 has a thickness of 100 nm, for instance.

Figure 4D:
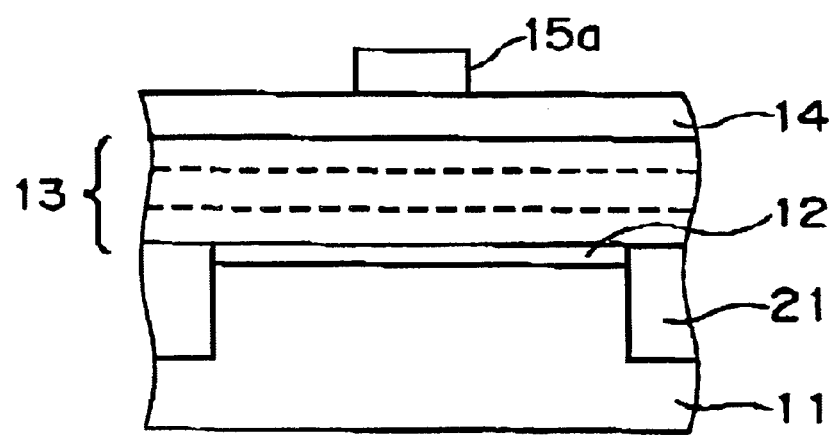
Figure 4E:
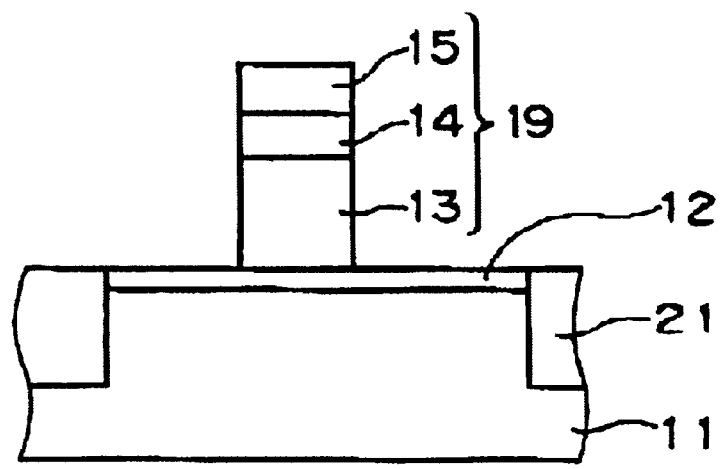

Then, a resist film (not illustrated) is formed on the silicon nitride (SiN) layer 15, and subsequently, is patterned by dry etching into an etching mask 15a for forming a gate electrode wiring, as illustrated in FIG. 4D.

After removal of the resist film and washing of the resultant, the tungsten silicide ($WSi_2$) layer 14 and the DOPOS layer 13 are dry-etched through the use of the etching mask 15a.

As a result, there is formed the multi-layered structure 19 on the gate oxide film 12. The multi-layered structure 19 is comprised of the DOPOS layer 13, the tungsten silicide ($WSi_2$) layer 14 and the silicon nitride layer 15 layered on the gate oxide film 12 in this order.

Then, rapid thermal annealing (RTA) is carried out to the multi-layered structure 19 in a nitrogen atmosphere at 1050 degrees centigrade for 40 seconds, for instance.

Figure 4F:
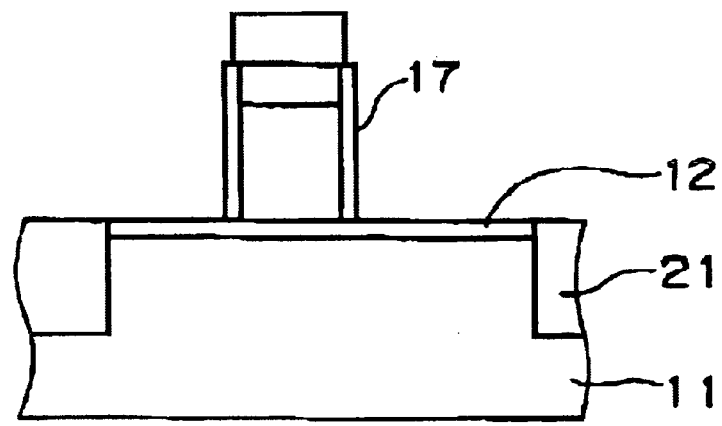

As a result, as illustrated in FIG. 4F, the DOPOS layer 13 and the tungsten silicide ($WSi_2$) layer 14 are nitrided only at sidewalls thereof, and hence, the silicon nitride (SiN) film 17 is formed on sidewalls of the DOPOS layer 13 and the tungsten silicide ($WSi_2$) layer 14. The thus formed silicon nitride (SiN) film 17 has a thickness in the rang of 1 to 2 nm both inclusive.

Then, rapid thermal annealing (RTA) is carried out to the multi-layered structure 19 in an oxygen atmosphere at 1100 degrees centigrade for 60 seconds, for instance.

Figure 4G:
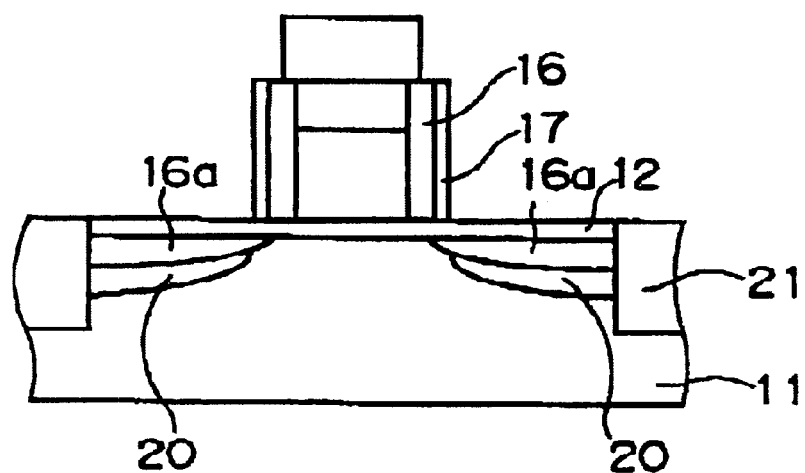

As a result of the rapid thermal annealing, as illustrated in FIG. 4G, the oxide film 16 is formed around the DOPOS layer 13 and the tungsten silicide ($WSi_2$) layer 14 covered with the silicon nitride (SiN) film 17, and the oxide film 16a is formed at a surface of the silicon substrate 11 not covered with the silicon nitride (SiN) film 17. For instance, the oxide film 16 has a thickness of 10 nm or smaller, and the oxide film 16a has a thickness of 7 nm or smaller.

Then, areas of the silicon substrate 11 in which NMOS and PMOS transistors are to be formed are covered with a resist film. Then, ion implantation is carried out to the silicon substrate 11 with the multi-layered structure 19 including the oxide film 16 and the silicon nitride film 17, being used as a mask.

Specifically, arsenic (As) is implanted into an area where an NMOS transistor is to be formed, and $BF_2$ is implanted into an area where a PMOS transistor is to be formed, for instance. As a result, the lightly-doped ion-implanted layer 20 having LDD (low-doped-drain) structure is formed in the silicon substrate 11 in association with the multi-layered structure 19.

Figure 4H:
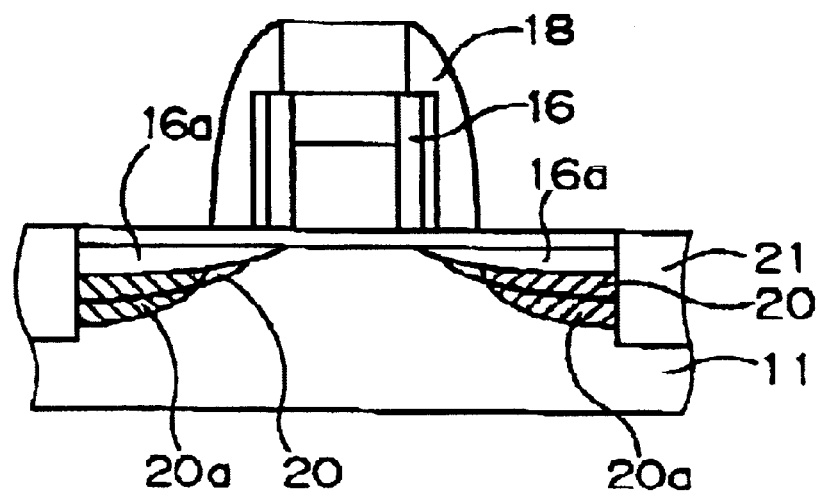

Then, for instance, a silicon nitride film having a thickness of about 40 nm is formed entirely over the multi-layered structure 19. By etching back the silicon nitride film, the sidewall 18 is formed on a sidewall of the multi-layered structure 19, as illustrated in FIG. 4H.

Then, the areas in which NMOS and PMOS transistors are to be formed are covered with a resist film. Then, ion implantation is carried out to the silicon substrate 11 with the multi-layered structure 19 including the sidewall 18, being used as a mask, similarly to the formation of the lightly-doped ion-implanted layer 20. As a result, the heavily-doped diffusion layer 20a is formed in the silicon substrate 11.

In the above-mentioned method of fabricating a semiconductor device, the multi-layered structure 19 is thermally annealed in a nitrogen atmosphere, when the silicon nitride (SiN) film 17 is formed on sidewalls of the DOPOS layer 13 and the tungsten silicide ($WSi_2$) layer 14. It is preferable that the nitrogen atmosphere contains nitrogen at 100%. Even if the nitrogen atmosphere slightly contains impurities, it would be possible to form the silicon nitride (SiN) film 17 in such nitrogen atmosphere. According to the analysis conducted by the inventors, it is necessary for the nitrogen atmosphere to contain an amount of impurities, particularly, an amount of oxygen as impurities at 1 volume percent or smaller.

If the silicon nitride (SiN) film 17 is attempted to be formed in a nitrogen atmosphere containing oxygen at more than one volume percent, the silicon nitride (SiN) film 17 could not be well formed, resulting in that the oxide film 16 to be formed around the DOPOS layer 13 and the tungsten silicide ($WSi_2$) layer 14 in a later step would have a thickness greater more than necessary.

In the above-mentioned method of fabricating a semiconductor device, the multi-layered structure 19 is thermally annealed in a nitrogen atmosphere at 1050 degrees centigrade. However, it should be noted that the multi-layered structure 19 may be thermally annealed at a temperature in the range of 1050 to 1100 degrees centigrade both inclusive.

The inventors had conducted the experiment to determine an optimal temperature at which the silicon nitride (SiN) 17 is formed around the DOPOS layer 13 and the tungsten silicide ($WSi_2$) layer 14.

In the experiment, the multi-layered structure 19 was annealed at 1000, 1050 and 1100 degrees centigrade for 60 seconds, and measurement was made as to how degree the silicon nitride (SiN) film 17 was formed in each of the temperatures. Table 1 shows the results of the experiment.

TABLE 1

|  | 1000° C. | 1050° C. | 1100° C. |
| --- | --- | --- | --- |
| $WSi_2$ | Δ | ○ | ◎ |
| DOPOS | X | Δ | ○ |
| $SiO_2$ | X | X | X |

In Table 1, "X" indicates that the silicon nitride (SiN) film 17 was not formed at all, "Δ" indicates that the silicon nitride (SiN) film 17 was formed to a usable degree, "○" indicates that the silicon nitride (SiN) film 17 was formed to a sufficient degree, and "◎" indicates that the silicon nitride (SiN) film 17 was formed to a more sufficient degree than "○".

As is obvious in view of the results shown in Table 1, an optimal temperature for forming the silicon nitride (SiN) film 17 around the DOPOS layer 13 and the tungsten silicide ($WSi_2$) layer 14 is in the range of 1050 to 1100 degrees centigrade both inclusive.

In the above-mentioned method of fabricating a semiconductor device including the gate electrode 10, though the WSi$_2$ layer 14 is used as a refractive metal silicide layer, it should be noted that a TiSi$_2$ layer, a VSi$_2$ layer, a CrSi$_2$ layer, a ZrSi$_2$ layer, a NbSi$_2$ layer, a MoSi$_2$ layer, a TaSi$_2$ layer, a CoSi$_2$ layer or a PdSi layer may be selected as a refractive metal silicide layer in place of the WSi$_2$ layer 14.

FIGS. 5A to 5D are cross-sectional views of a semiconductor device including the gate electrode in accordance with the second embodiment of the present invention, illustrating respective steps in a process of fabricating the same.

Figure 5A:
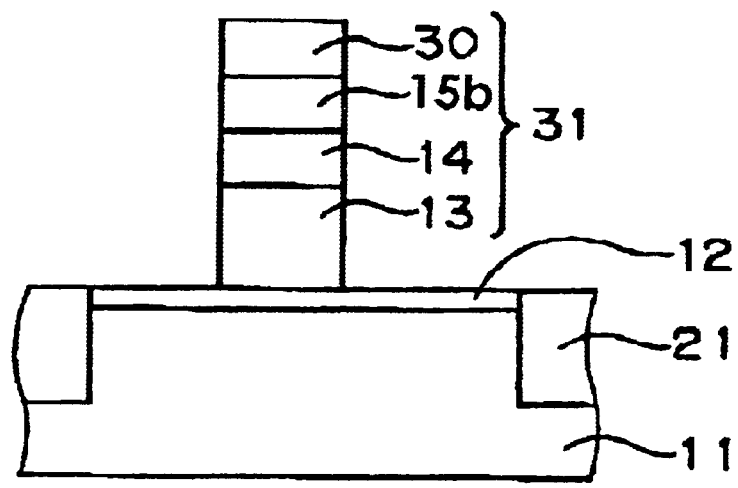
FIGS. 5A to 5D are cross-sectional views of a semiconductor device including the gate electrode in accordance with the second embodiment of the present invention, illustrating respective steps in a process of fabricating the same.

First, as illustrated in FIG. 5A, insulating layers 21 are formed at a surface of a p-type silicon substrate 11 to thereby define device fabrication areas in each of which a transistor is to be fabricated, similarly to the above-mentioned method of fabricating a semiconductor device including the gate electrode 10.

Then, the p-type silicon substrate 11 is thermally annealed in a steam and oxygen gas atmosphere, for instance, at 850 degrees centigrade for 4 hours.

As a result, a silicon dioxide film as the gate oxide film 12 is formed at a surface of the p-type silicon substrate 11 in a device fabrication area.

Then, as illustrated in FIG. 5A, a multi-layered structure 31 is formed on the silicon dioxide film 12. The multi-layered structure 31 is comprised of the DOPOS layer 13 formed on the silicon dioxide layer 12, the tungsten silicide (WSi$_2$) layer 14 formed on the DOPOS layer 13, a metal layer 15b, composed of tungsten and formed on the tungsten silicide (WSi$_2$) layer 14, and a Si$_8$N$_4$ layer 30 formed on the metal layer 15b.

The metal layer 15b has a two-layered structure including a tungsten nitride (WN) layer as a lower layer, and a tungsten (W) layer as an upper layer.

For instance, the DOPOS layer 13, the tungsten silicide (WSi$_2$) layer 14, the tungsten nitride layer, and the tungsten layer have a thickness of 100 nm, 3 to 20 nm both inclusive, 10 nm and 80 nm, respectively.

Then, rapid thermal annealing (RTA) is carried out to the multi-layered structure 31 in a nitrogen atmosphere containing impurities, particularly, oxygen at 1 volume percent or smaller at 1100 degrees centigrade for 40 seconds.

Figure 5B:
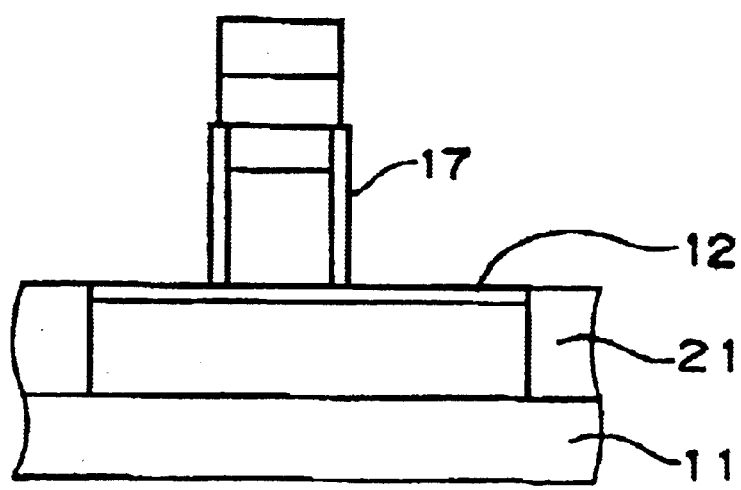

As a result, as illustrated in FIG. 5B, the DOPOS layer 13 and the tungsten silicide (WSi$_2$) layer 14 are nitrided only at sidewalls thereof, and hence, the silicon nitride (SiN) film 17 is formed on sidewalls of the DOPOS layer 13 and the tungsten silicide (WSi$_2$) layer 14. The thus formed silicon nitride (SiN) film 17 has a thickness in the rang of 1 to 2 nm both inclusive.

Then, the multi-layered structure 31 is oxidized in an atmosphere of a mixture gas of hydrogen and oxygen at 800 degrees centigrade for 30 minutes, for instance.

As a result, though the metal layer 15b comprised of the tungsten layer and the tungsten nitride layer is not oxidized, the silicon substrate 11, the DOPOS layer 13 and the tungsten silicide (WSi$_2$) layer 14 are oxidized.

Figure 5C:
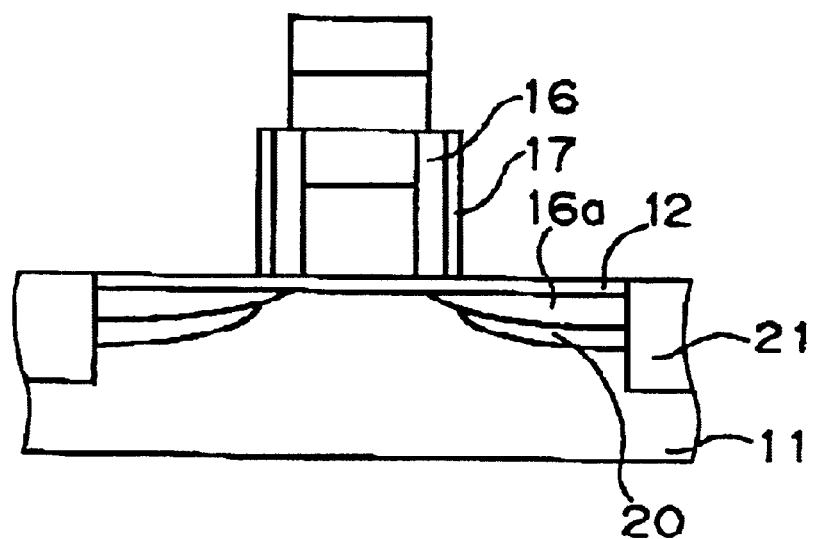

As a result of the oxidation of the multi-layered structure 31, as illustrated in FIG. 5C, the oxide film 16 not projecting horizontally is formed around the DOPOS layer 13 and the tungsten silicide (WSi$_2$ layer 14 covered with the silicon nitride (SiN) film 17, and the oxide film 16a is formed at a surface of the silicon substrate 11 not covered with the silicon nitride (SiN) film 17.

Then, areas of the silicon substrate 11 in which NMOS and PMOS transistors are to be formed are covered with a resist film. Then, ion implantation is carried out to the silicon substrate 11 with the multi-layered structure 31 including the oxide film 16 and the silicon nitride film 17, being used as a mask.

Specifically. arsenic (As) is implanted into an area where an NMOS transistor is to be formed, and BF$_2$ is implanted into an area where a PMOS transistor is to be formed, for instance. As a result, the lightly-doped ion-implanted layer 20 having LDD (low-doped-drain) structure is formed in the silicon substrate 11 in association with the multi-layered structure 31.

Figure 5D:
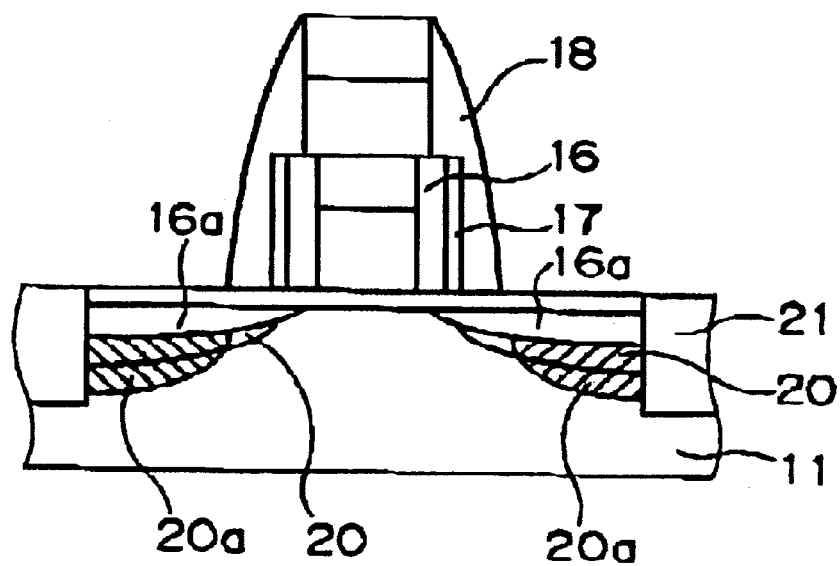

Then, for instance, a silicon nitride film is formed entirely over the multi-layered structure 31. By etching back the silicon nitride film, the sidewall 18 is formed on a sidewall of the multi-layered structure 31, as illustrated in FIG. 5D.

Then, the areas in which NMOS and PMOS transistors are to be formed are covered with a resist film. Then, ion implantation is carried out to the silicon substrate 11 with the multi-layered structure 31 including the sidewall 18, being used as a mask, similarly to the formation of the lightly-doped ion-implanted layer 20. As a result, the heavily-doped diffusion layer 20a is formed in the silicon substrate 11.

In the above-mentioned method, though the WSi$_2$ layer 14 is used as a refractive metal silicide layer, it should be noted that a TiSi$_2$ layer, a VSi$_2$ layer, a CrSi$_2$ layer, a ZrSi$_2$ layer, a NbSi$_2$ layer, a MoSi$_2$ layer, a TaSi$_2$ layer, a CoSi$_2$ layer or a PdSi layer may be selected as a refractive metal silicide layer in place of the WSi$_2$ layer 14.

In addition, though the metal layer 15b is designed to include the tungsten (W) layer and the tungsten nitride (WN) layer, the metal layer 15b may be designed to include Mo/MoN layers, Ti/TiN layers or Ta/TaN layers in place of the W/WN layers.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-25179 filed on Feb. 1, 2002 including specification, claims, drawings and summary is incorporated herein by reference in its entirety.

What is claimed is:

1. A method of fabricating a gate electrode comprising the steps of:
   (a) forming a gate oxide film at a surface of a semiconductor substrate;
   (b) forming a multi-layered structure on said gate oxide film, said multi-layered structure including a polysilicon layer formed on said gate oxide film, a refractive metal silicide layer formed on said polysilicon layer, and a silicon nitride layer formed on said refractive metal silicide layer;
   (c) thermally annealing said multi-layered structure in a nitrogen atmosphere and forming a silicon nitride film only on sidewalls of said polysilicon layer and said refractive metal silicide layer; and
   (d) rapidly thermally oxidizing said semiconductor substrate and said multi-layered structure after said step (c) so that said silicon nitride film prevents penetration of oxygen into said polysilicon layer and said refractive metal silicide layer.

2. The method as set forth in claim 1, wherein a refractive metal layer is further formed between said refractive metal silicide layer and said silicon nitride layer in said step (b).

3. The method as set forth in claim 2, wherein said refractive metal layer is composed of any one of tungsten (W), molybdenum (Mo), titanium (Ti) and tantalum (Ta).

4. The method as set forth in claim 1, wherein said refractive metal silicide layer is composed of any one of $WSi_2$, $TiSi_2$, $VSi_2$, $CrSi_2$, $ZrSi_2$, $NbSi_2$, $MoSi_2$, $TaSi_2$, $CoSi_2$ and $PdSi$.

5. The method as set forth in claim 1, wherein said nitrogen atmosphere contains impurity other than nitrogen at 1 volume percent or smaller.

6. The method as set forth in claim 5, wherein said impurity is oxygen.

7. The method as set forth in claim 1, wherein said multi-layered structure is thermally annealed in said step (c) at 1050 to 1100 degrees centigrade both inclusive.

* * * * *